United States Patent [19]

Yamada et al.

[11] 4,182,963

[45] Jan. 8, 1980

[54] PULSE SHAPING CIRCUIT

[75] Inventors: Tsuneo Yamada; Yukihiko Miyamoto, both of Tokyo, Japan

[73] Assignee: Trio Kabushiki Kaisha, Tokyo, Japan

[21] Appl. No.: 859,539

[22] Filed: Dec. 12, 1977

[30] Foreign Application Priority Data

Dec. 28, 1976 [JP] Japan ................... 51-159459

[51] Int. Cl.² ............................................. H03K 5/01
[52] U.S. Cl. ................................... 307/268; 307/358; 328/110; 328/127
[58] Field of Search ............... 328/110, 127; 307/268, 307/358

[56] References Cited

U.S. PATENT DOCUMENTS

| 3,054,064 | 9/1962 | Sherman | 328/127 X |
| 3,192,408 | 6/1965 | Cho | 307/268 X |
| 3,505,537 | 4/1970 | Giordano | 328/127 X |
| 3,686,577 | 8/1972 | Fruhauf | 307/358 X |

Primary Examiner—John S. Heyman
Attorney, Agent, or Firm—Gerald J. Ferguson, Jr.; Joseph J. Baker

[57] ABSTRACT

A pulse shaping circuit comprising a difference amplifier having an input terminal for receiving an input pulse to be shaped and first and second output terminals, an integration circuit connected to the second output terminal, and an AND circuit connected to the first output terminal and the integration circuit for developing an output pulse corresponding to the shaped input pulse.

4 Claims, 5 Drawing Figures

PULSE SHAPING CIRCUIT

BACKGROUND OF THE INVENTION

1. Field of the Invention

This invention is directed to a pulse shaping circuit and in particular to such a circuit that shapes an input pulse signal for obtaining a trigger pulse signal synchronous with the input pulse signal.

2. Discussion of the Prior Art

Conventional circuits for achieving trigger pulses to trigger multivibrator circuits comprise a differentiation circuit 3 having a condenser $C_1$ and a resistor $R_1$. Specifically, when an input pulse signal as shown in FIG. 2(A) is imposed at input terminal 1, the differentiated output pulse signal as shown in FIG. 2(B) is produced at the output terminal 2. This output pulse signal is used as a trigger pulse. However, a sufficient amplitude is not produced when a trigger pulse with a small pulse width is generated by this conventional circuit. Further, the pulse width is not sufficiently small when a trigger pulse of a high amplitude is to be generated.

SUMMARY OF THE INVENTION

This invention comprises a pulse shaping circuit which can deliver a trigger pulse with a small pulse width and sufficiently high amplitude, eliminating these problems.

Other objects and advantages of this invention will be apparent from a reading of the following specification and claims taken with the drawing.

BRIEF DESCRIPTION OF THE PREFERRED EMBODIMENTS

Figure 1:
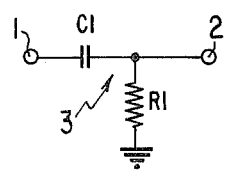
FIG. 1 is a schematic circuit diagram of a conventional pulse shaping circuit.
Figure 2:
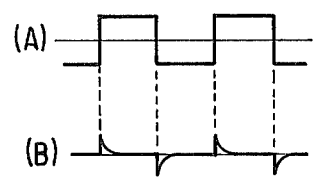
FIGS. 2(A) and 2(B) are pulse wave shapes illustrating the operation of FIG. 1.
Figure 3:
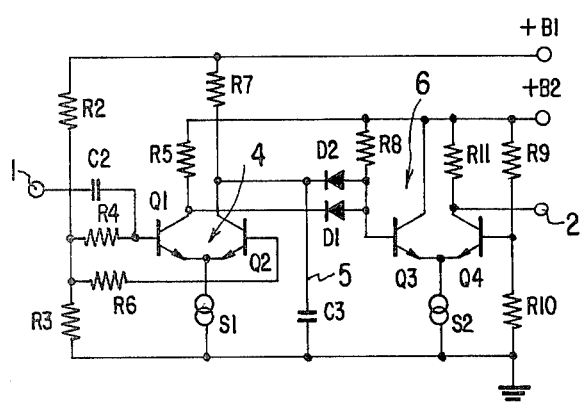
FIG. 3 is a schematic circuit diagram of an illustrative embodiment of a pulse shaping circuit in accordance with this invention.
Figure 4:
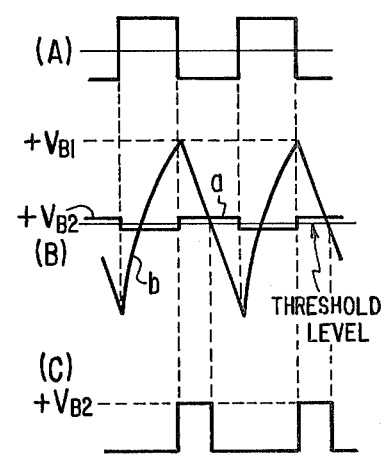
FIGS. 4A, 4B and 4C are pulse wave shapes illustrating the operation of FIG. 3.

FIG. 3 is a schematic circuit diagram of one illustrative embodiment of a pulse shaping circuit in accordance with this invention. In the Figure 4, is a difference amplifier comprising transistors $Q_1$ and $Q_2$. The base of transistor $Q_1$ is connected to input terminal 1 through condenser $C_2$. In addition, it is connected via resistance $R_4$ to resistances $R_2$ and $R_3$ which are linked in series with a primary power source $+B_1$. The emitter is connected to a constant current source $S_1$. The collector is connected with a second power source $+B_2$ via resistance $R_5$. The base of transistor $Q_2$ is connected to the contact point of resistances $R_2$ and $R_3$ via resistance $R_6$. The emitter is connected to constant current source $S_1$ and the collector is connected to primary power source $+B_1$ via resistance $R_7$. The line voltage $+V_{B1}$ of primary power source $B_1$ is set at a higher level than the line voltage $+V_{B2}$ of second power source $+B_2$. Condenser $C_3$ is connected between the collector of transistor $Q_2$ and the ground. This condenser $C_3$ and resistance $R_7$ form an integration circuit 5. 6 is a logical operation circuit which performs a logical product or AND operation. It comprises diodes $D_1$, $D_2$ and a difference amplifier based on transistors $Q_3$ and $Q_4$. The base of transistor $Q_3$ is connected via diodes $D_1$ and $D_2$ to the collectors of transistors $Q_1$ and $Q_2$. In addition, it is connected via resistance $R_8$ to second power source $+B_2$. The emitter is connected to a constant current source $S_2$. The collector is connected to second power source $+B_2$. The base of transistor $Q_4$ is connected to the contact point of $R_{10}$ and $R_9$ which are connected in series with second power source $+B_2$. The collector is linked with second power source $+B_2$ via resistance $R_{11}$ and with an output terminal 2.

When an input pulse signal as shown in FIG. 4(A) is applied to input terminal 1, transistor $Q_1$ is on and transistor $Q_2$ is off when this input pulse signal is at a high level. Transistor $Q_1$ is off and transistor $Q_2$ is on when the signal is at a low level. An output pulse signal from the collector of transistor $Q_1$ is produced as shown by curve a in FIG. 4(B). An output pulse signal with a phase opposite the collector output of transistor $Q_1$ is produced at the collector of transistor $Q_2$. The output pulse signal from the collector of transistor $Q_2$ is integrated by condenser $C_3$ of integration circuit 5 and an output signal as shown by curve b in FIG. 4(B) is produced. The output of integration circuit 5 and the collector output of transistor $Q_1$ are applied to diodes $D_1$ and $D_2$ and the logical product thereof is obtained. When at least one of these output levels is lower than the threshold level determined by transistor $Q_4$, resistance $R_9$ and resistance $R_{10}$, the transistor $Q_3$ is off and transistor $Q_4$ is on. When the levels of both outputs exceed the threshold level, transistor $Q_3$ switches on while transistor $Q_4$ switches off. At that time, an output pulse signal like the one shown in FIG. 4(C) is produced at output terminal 2. Accordingly, the output pulse signal achieved at output terminal 2 is synchronous with the input pulse signal and it has a small pulse width. It is a pulse signal appropriate for use as a trigger pulse signal.

Since the line voltage of primary power source $+B_1$ connected to transistor $Q_2$ and to the integration circuit 5 is higher than the line voltage of the second power source $+B_2$, it is possible to select a small amplitude output pulse signal from the collector of transistor $Q_1$ and prevent radiation.

Figure 5:
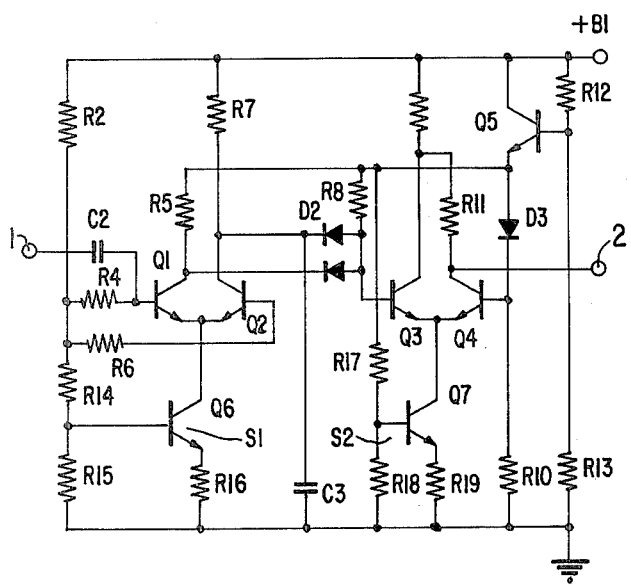
FIG. 5 is a schematic circuit diagram of a further illustrative embodiment of a pulse shaping circuit in accordance with this invention.

FIG. 5 is a schematic circuit diagram of a further embodiment of a pulse shaping circuit in accordance with the invention. The second line voltage of FIG. 4 is implemented by a constant voltage circuit comprising resistances $R_{12}$, $R_{13}$ and transistor $Q_5$ connected to primary power source $+B_1$. Moreover, the constant current source $S_1$ comprises resistances $R_{14}$, $R_{15}$, $R_{16}$ and transistor $Q_6$. The constant current source $S_2$ comprises resistances $R_{17}$, $R_{18}$, $R_{19}$ and transistor $Q_7$. The diode $D_3$ is connected between the emitter of transistor $Q_5$ and the base of transistor $Q_4$. The threshold level of the logical AND operation of logical operation circuit 6 is thus determined. In any case, a very stable logical AND operation can be implemented if the amplitude of the output pulse signal from the collector of transistor $Q_1$ is about double the forward voltage drop of diode $D_3$.

As indicated above, with the simple circuitry of this invention, a very stable trigger pulse is obtained in which the pulse width of the trigger pulse is sufficiently small and the amplitude is sufficiently large. Moreover, this pulse shaping circuit can easily be integrated.

What is claimed is:

1. A pulse shaping circuit for producing a shaped output pulse having a predetermined amplitude and width comprising
   a difference amplifier having an input terminal for receiving an input pulse to be shaped and for producing first and second signals having at least a square wave leading edge at first and second output terminals;
   an integration circuit for integrating said second signal to produce a ramp signal; and
   an AND circuit having applied thereto said first signal and the ramp signal produced by said integration circuit for developing said shaped output pulse corresponding to the input pulse.

2. A pulse shaping circuit for producing a shaped trigger pulse having a predetermined amplitude and width comprising
   a difference amplifier for producing output pulse signals of mutually opposite phase having at least a square wave leading edge upon application of an input pulse signal to the input terminal of the difference amplifier;
   an integration circuit connected to one output terminal of said difference amplifier to integrate one of said output pulse signals and produce a ramp signal; and
   a logical operation circuit having applied thereto the ramp signal and the output pulse signal from the other output terminal of said difference amplifier for producing the logical product of the ramp signal and the output pulse signal from said other output terminal, said logical product being said shaped trigger pulse signal produced at the output of said logical operation circuit.

3. A pulse shaping circuit comprising
   a difference amplifier having an input terminal for receiving an input pulse to be shaped and first and second output terminals;
   an integration circuit connected to said second output terminal;
   an AND circuit connected to said first output terminal and said integration circuit for developing an output pulse corresponding to the shaped input pulse; and
   said difference amplifier comprising first and second transistors, said first and second output terminals being at the respective collectors of said first and second transistors and said second collector being connected to a power supply voltage greater than that connected to said first collector.

4. A pulse shaping circuit comprising
   a difference amplifier having an input terminal for receiving an input pulse to be shaped and first and second output terminals;
   an integration circuit responsive to said second output terminal;
   an AND circuit responsive to said first output terminal and said integration circuit for developing an output pulse corresponding to the shaped input pulse; and
   said integration circuit charging and discharging to values of voltage greater than the maximum and minimum voltage swings at said first output terminal.

* * * * *